United States Patent
Muramatsu

[11] Patent Number: 6,013,564
[45] Date of Patent: Jan. 11, 2000

[54] METHOD OF MANUFACTURING SEMICONDUCTOR WAFER WITHOUT MIRROR POLISHING AFTER FORMATION OF BLOCKING FILM

[75] Inventor: Satoru Muramatsu, Tokyo, Japan

[73] Assignee: NEC Corporation, Tokyo, Japan

[21] Appl. No.: 08/912,469

[22] Filed: Aug. 18, 1997

[30] Foreign Application Priority Data

Oct. 3, 1996 [JP] Japan .................................. 8-263324

[51] Int. Cl.[7] .......................... H01L 21/301; H01L 21/46; H01L 21/78
[52] U.S. Cl. .......................... 438/460; 438/692; 438/693; 438/974; 438/959; 438/928
[58] Field of Search ..................... 438/928, 974, 438/959, 460, 692, 693

[56] References Cited

U.S. PATENT DOCUMENTS

| | | | |
|---|---|---|---|
| 3,511,727 | 5/1970 | Hays | ........................................ 156/17 |
| 4,398,410 | 8/1983 | Nakajima et al. | ....................... 148/172 |
| 5,489,557 | 2/1996 | Jolley et al. | .............................. 438/476 |

*Primary Examiner*—John F. Niebling
*Assistant Examiner*—David A. Zarneke
*Attorney, Agent, or Firm*—Hayes Soloway Hennessey Grossman & Hage PC

[57] ABSTRACT

In a method of manufacturing a semiconductor substrate, a first stage semiconductor substrate wafer is cut out from an ingot. Then, a chemical mechanical polishing process is performed to the first stage semiconductor substrate wafer to produce a second stage semiconductor substrate wafer respectively having mirror surfaces on front and rear surfaces of the second stage semiconductor substrate wafer. Subsequently, a third stage semiconductor substrate wafer is produced from the second stage semiconductor substrate wafer without performing an additional chemical mechanical polishing process, to have a blocking film on the rear surface and a mirror surface on the front surface. Finally, an epitaxial layer is grown on the front surface of the third stage semiconductor substrate wafer.

17 Claims, 5 Drawing Sheets

METHOD OF MANUFACTURING SEMICONDUCTOR WAFER WITHOUT MIRROR POLISHING AFTER FORMATION OF BLOCKING FILM

BACKGROUND OF THE INVENTION

1. Field of the Invention

The present invention relates to a method and apparatus for manufacturing a semiconductor substrate, and more particularly to a method and apparatus for efficiently manufacturing a silicon substrate on which an epitaxial layer is grown.

2. Description of the Related Art

A conventional example of a method of manufacturing a silicon substrate on which an epitaxial layer is grown will be described below with reference FIG. 1A to 1G.

Figure 1:
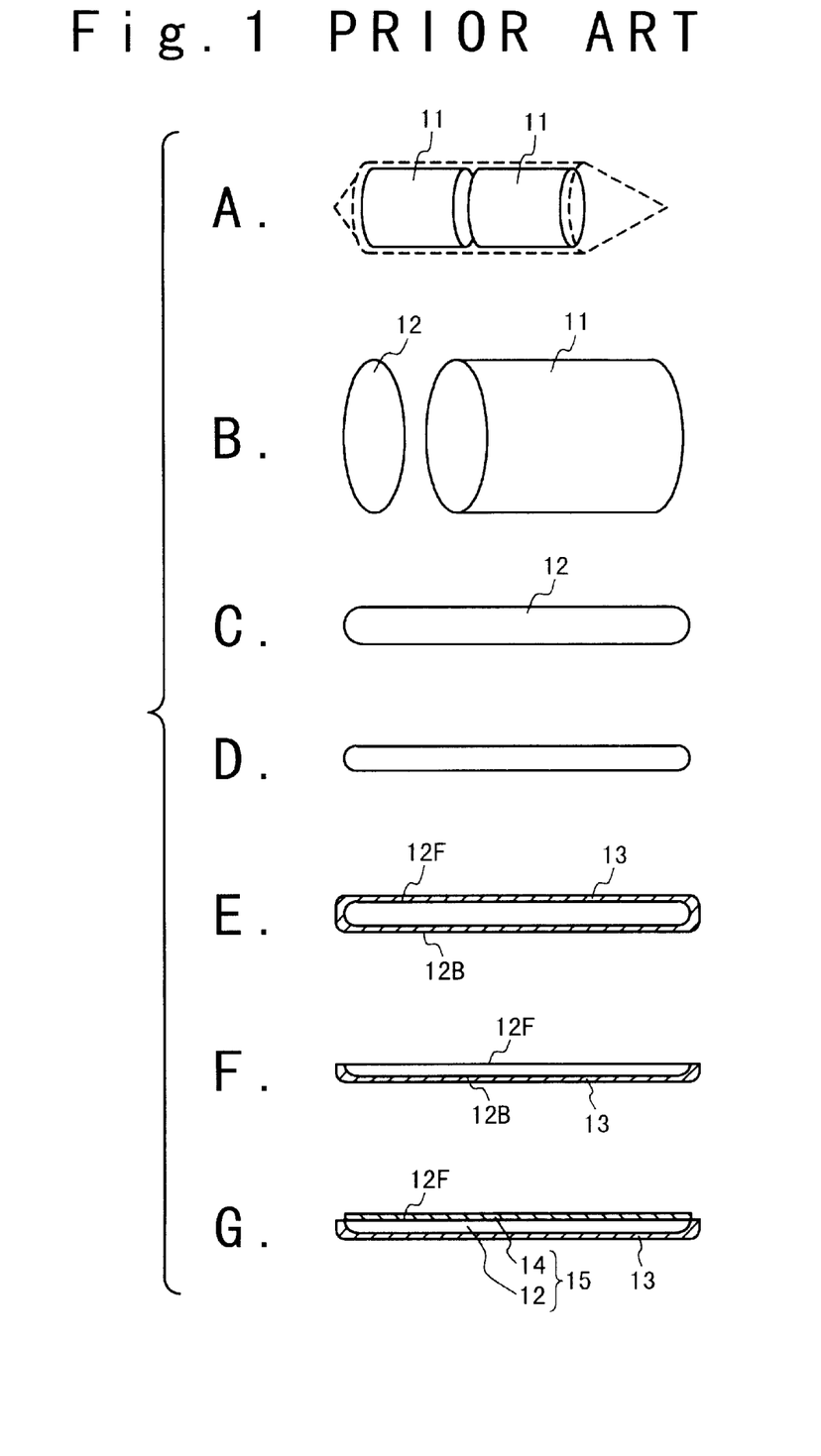
FIGS. 1A to 1G are diagrams illustrating a conventional method of manufacturing a semiconductor substrate.

In the conventional example of the manufacturing method, as shown in FIG. 1A, a silicon single crystal ingot 11 is cut out and then a rounding process is performed. In the slicing process which is shown in FIG. 1B, a silicon substrate 12 having a wafer shape is cut down from the silicon single crystal ingot 11 which is subjected to a cutting process and a rounding process.

Next, as shown in FIG. 1C, a beveling process is performed to cut down corners in the peripheral portion of the silicon substrate 12. Subsequently, as shown in FIG. 1D, a mechanical polishing (lapping) process is performed to make the surface of the silicon substrate 12 even, so that flaws on the surface are made small and the parallel degree is increased.

Next, as shown in FIG. 1E, a damage layer which has been formed in the surface layer of the silicon substrate 12 during the mechanical polishing process is removed by etching. Thereafter, a blocking film forming process is performed to form a blocking film 13 on the front and rear surfaces 12F and 12B of the silicon substrate 12 so as to prevent an auto-doping phenomenon.

Subsequently, as shown in FIG. 1F, a mirror polishing process is performed. In the mirror polishing process, flaws on the substrate surface which can not be removed in the mechanical polishing process is removed by a chemical mechanical polishing (CMP) method such that the surface of the silicon substrate 12 is made shaped like a mirror.

Finally, as shown in FIG. 1G, an epitaxial silicon layer 14 is formed on the surface of polished silicon substrate 12.

In this way, a semiconductor substrate (a wafer) 15 on which the epitaxial silicon layer 14 has been grown on the silicon substrate 12 is manufactured.

Generally, the silicon substrate 12 is often formed to have a high density of impurity ions doped into either of a P type or N type conductive type. Also, in order to perform the epitaxial growth on the silicon substrate 12, the silicon substrate 12 must be heated to a temperature in a range of 1000 to 1200° C. The impurity ions such as boron ions, phosphorus ions, antimony ions and arsenic ions are doped in the silicon substrate 12. Therefore, when the silicon substrate having a high density of impurity ions doped is heated in the stage in which the blocking film 13 is not formed, the impurity ions doped in the silicon substrate 12 escape from the silicon substrate 12 due to the heat. As a result, the so-called auto-doping phenomenon occurs, that is, the impurity ions enter into the epitaxial growth layer 14. This phenomenon changes the electric characteristic of the silicon substrate with the epitaxial growth layer 14. Therefore, in the manufacturing process of the silicon substrate with the epitaxial growth layer, it is absolutely necessary to form the blocking film 13. The blocking film 13 is generally formed of a silicon oxide film ($SiO_2$), a silicon nitride film ($Si_3N_4$) or the like, using a CVD method, a thermal oxidation method, a thermal nitride method and so on.

In the conventional technique which is shown in FIGS. 1A to 1G, the blocking film 13 is formed on a front surface 12F of the silicon substrate on which the epitaxial layer 14 is formed where semiconductor elements are formed, and a rear surface 12B opposite to the front surface 12F. The blocking film 13 on the front surface 12F is removed in the chemical mechanical polishing process such that the front surface 12F is exposed, as shown in FIG. 1F.

However, when the blocking film 13 is removed through the mirror polishing process in this way, there is the possibility that new flaws are formed on the surface in the removal of the blocking film. In accordance with, in order to remove the new flaws and to achieve the mirror surface of the silicon substrate, the mirror polishing process needs to be performed for a long time.

Also, the technique that the mirror polishing process is performed to both surfaces of the silicon substrate for improvement of the parallel degree and for reduction of the number of processes can not be applied to the manufacturing method shown in FIGS. 1A to 1G. This is because the blocking film as the essential film is removed from the both surfaces.

Further, in the manufacturing method shown in FIGS. 1A to 1G, when the mirror polishing process is performed to the both surfaces before the blocking film is formed, productivity decreases. This is because the two chemical mechanical polishing processes, i.e., the mirror polishing process for polishing the both surfaces and the mirror polishing process for removing the blocking film become necessary.

SUMMARY OF THE INVENTION

The present invention is accomplished in the light of the above-mentioned situations. Therefore, an object of the present invention is to provide a method of manufacturing a semiconductor substrate without performing an additional mirror polishing process, and an apparatus for the method.

In order to achieve an aspect of the present invention, a method of manufacturing a semiconductor substrate, includes the steps of:

cutting out a first stage semiconductor substrate wafer from an ingot;

performing a chemical mechanical polishing process to the first stage semiconductor substrate wafer to produce a second stage semiconductor substrate wafer respectively having mirror surfaces on front and rear surfaces of the second stage semiconductor substrate wafer;

producing, from the second stage semiconductor substrate wafer, a third stage semiconductor substrate wafer which has a blocking film on the rear surface and a mirror surface on the front surface without performing an additional chemical mechanical polishing process; and growing an epitaxial layer on the front surface of the third stage semiconductor substrate wafer.

The third stage semiconductor substrate wafer is produced by forming the blocking film on the front and rear surfaces of the second stage semiconductor substrate wafer to produce a fourth stage semiconductor substrate wafer, and etching the blocking film from the front surface of the fourth stage semiconductor substrate wafer to produce the third stage semiconductor substrate wafer. In this case, the fourth stage semiconductor substrate wafer is placed on a sealing member such that the sealing member is applied to a peripheral portion on the rear surface of the fourth stage semiconductor substrate wafer. Pressure is reduced on a side of the rear surface of the fourth stage semiconductor substrate wafer. Thus, the blocking film is removed from the front surface of the fourth stage semiconductor substrate wafer. The etching step includes flowing an etching gas on a side of the front surface of the fourth stage semiconductor substrate wafer. Generally, the blocking film is formed of a silicon oxide film and the etching gas is a hydrofluoric acid. Instead, in the etching step, an etching solution may be use.

Alternatively, in the step of producing a third stage semiconductor substrate wafer, the blocking film may be formed on the rear surface of the second stage semiconductor substrate wafer to produce the third stage semiconductor substrate wafer. In this case, the front surface of the second stage semiconductor substrate wafer is exposed to an inert gas. Also, the rear surface of the second stage semiconductor substrate wafer is exposed to a gas for growing the blocking film. Further, a step of heating the second stage semiconductor substrate wafer may be added. In this case, pressure of the inner gas is higher than that of the gas for growing the blocking film.

In order to achieve another aspect of the present invention, a method of manufacturing a semiconductor substrate, includes the steps of:

cutting out a semiconductor substrate wafer from an ingot;

performing a chemical mechanical polishing process to the semiconductor substrate wafer such that the semiconductor substrate wafer has mirror surfaces on front and rear surfaces of the semiconductor substrate wafer;

forming a blocking film on the front and rear mirror surfaces of the semiconductor substrate wafer; and etching the blocking film on the front surface of the semiconductor substrate wafer.

In order to achieve still another aspect of the present invention, a method of manufacturing a semiconductor substrate, includes the steps of:

cutting out a semiconductor substrate wafer from an ingot;

performing a chemical mechanical polishing process to the semiconductor substrate wafer such that the semiconductor substrate wafer has mirror surfaces on front and rear surfaces of the semiconductor substrate wafer;

forming a blocking film on the rear mirror surface of the semiconductor substrate wafer; and growing an epitaxial layer on the front mirror surface of the semiconductor substrate wafer.

In order to achieve yet still another aspect of the present invention, an apparatus for etching a front surface of a semiconductor substrate wafer, includes a wafer supporting base whose upper plate has an opening, a chamber located on the wafer supporting base, a sealing member located on the upper plate around the opening to receive a rear surface of a semiconductor substrate wafer on the sealing member, a vacuum section for reducing pressure of the wafer supporting base when the semiconductor substrate wafer is located on the sealing member, and a supply section for supplying an etching agent into the upper section to etch a front surface of the semiconductor substrate wafer.

In order to achieve an aspect of the present invention, an apparatus for forming a film on a front surface of a semiconductor substrate wafer, includes a chamber which is divided into upper and lower sections by a plate which has an opening which has a diameter smaller than that of the semiconductor substrate wafer, a first supply section for supplying an inert gas into the upper section after the semiconductor substrate wafer is placed on the plate to cover the opening, a second supply section for supplying a film growing gas into the lower section after the semiconductor substrate wafer is placed on the plate to cover the opening, and a heating section for heating the semiconductor substrate wafer.

DETAILED DESCRIPTION OF THE PREFERRED EMBODIMENTS

A method of manufacturing a semiconductor substrate of the present invention will be described below in detail with reference to the accompanying drawings.

FIG. 2A to 2I is perspective views and cross sectional views illustrating the manufacturing method of the semiconductor substrate according to the first embodiment of the present invention.

Figure 2:
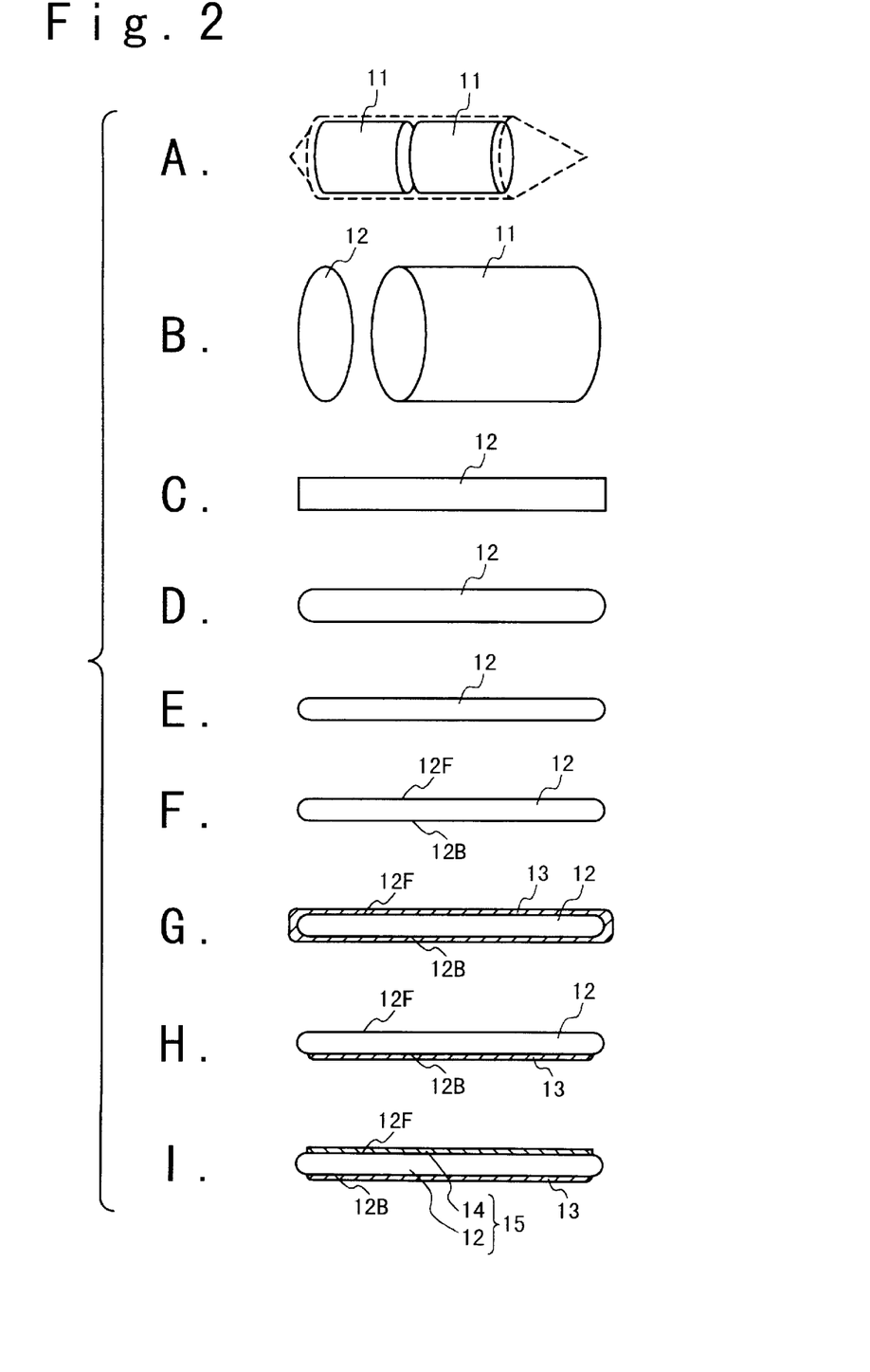
FIGS. 2A and 2I are process diagrams illustrating a method of manufacturing a semiconductor substrate according to a first embodiment of the present invention.

In the manufacturing method of the semiconductor substrate in the first embodiment, as shown in FIG. 2A, a silicon single crystal ingot 11 is cut down and then a rounding process is performed. In the slicing process which is shown by FIGS. 2B and 2C, a silicon substrate 12 having a wafer shape is cut out from the silicon single crystal ingot 11 which is subjected to a cutting process and a rounding process.

Next, as shown in FIG. 2D, a beveling process is performed to cut down corners in the peripheral portion of the silicon substrate 12. Subsequently, as shown in FIG. 2E, a mechanical polishing (lapping) process is performed to make the surface of the silicon substrate 12 even, so that flaws on the surface are made small and the parallel degree is increased.

Next, as shown in FIG. 2F, a damage layer which has been formed in the surface layer of the silicon substrate 12 during the mechanical polishing process is removed by etching. Subsequently, a mirror polishing process is performed to the front and rear surfaces 12F and 12B of the silicon substrate 12. In the mirror polishing process, flaws on the substrate surface which can not be removed in the mechanical polishing process is removed by a chemical mechanical polishing (CMP) method such that the surface of the silicon substrate 12 is made shaped like a mirror.

Thereafter, a blocking film forming process is performed to form a blocking film 13 such as a silicon oxide film and a silicon nitride film on the whole of front and rear surfaces 12F and 12B of the silicon substrate 12 by a thermal oxidation method, a thermal nitride method, a CVD method or the like.

In this case, the both surfaces 12F and 12B of the silicon substrate 12 are already produced in a mirror surface stage by the mechanical chemical polish. Therefore, contact areas of a support tool and the silicon substrate 12 must be provided on the rear surface of the silicon substrate side and in the peripheral portion thereof.

Also, the blocking film 13 must be formed on the rear surface 12B of the silicon substrate 12 at least to inhibit an auto-doping phenomenon from the rear surface.

Next, as shown in FIG. 2H, the blocking film 13 is etched and removed. A sealing member such as an O-ring is provided on a support base. The silicon substrate 12 is mounted on the O-ring located on the support base. The silicon substrate 12 is drawn to the support base via the O-ring by a vacuum sucking method.

After this, using etching agent of hydrofluoric acid and so on, the blocking film 13 is removed from the front surface 12F of the silicon substrate 12. At this time, as the method of removing a blocking film, various method may be employed in which vapors of liquid solution of the etching agent are blown to the silicon substrate 12 or the silicon substrate 12 is soaked in the liquid solution of the etching agent. In this case, because the rear surface 12B of the silicon substrate 12 is sealed by the O-ring and the support base, the blocking film 13 on the rear surface 12B is not removed by the liquid solution of the etching agent.

Figure 3:
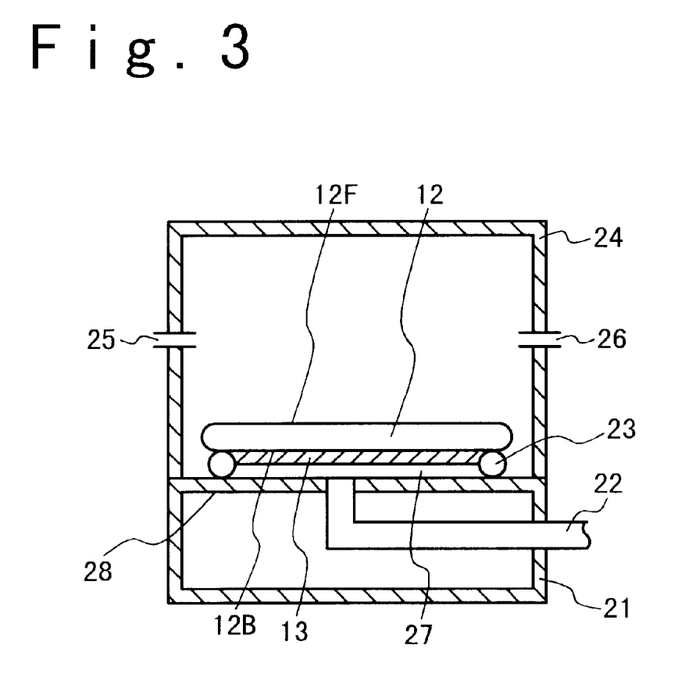
FIG. 3 is a cross sectional view illustrating a manufacturing apparatus used in the method of manufacturing the semiconductor substrate according to the first embodiment of the present invention.

FIG. 3 is a schematic diagram of a manufacturing apparatus used in the etching process shown in FIG. 2H. A chamber 24 is provided on a support base 21. An upper plate 28 of the support base 21 has an opening at the center and the opening is connected to a pipe 22. A sealing member such as an O-ring 23 is provided around the opening on the support base 21 to contact the peripheral portion of the rear surface 12B of the silicon substrate 12. The opening is connected to a vacuum system through the pipe 22. Thus, air in a space 27 formed by the silicon substrate 12, the O-ring 23 and the upper plate 28 is exhausted through the pipe 22 so that the space 27 is decompressed. As a result, the silicon substrate 12 is drawn to the support base 21 via the O-ring 23, as in a vacuum sucking method.

A gas introducing pipe 25 and a gas exhausting pipe 26 are provided for the chamber 24. An etching gas of hydrofluoric acid and so on is introduced from the gas introducing pipe 25 and the inside of the chamber 24 is filled with the etching gas of hydrofluoric acid. Thus, the blocking film 13 on the front surface 12F of the silicon substrate 12 is etched such that the new front surface 12F of the silicon substrate 12 is exposed. In this case, the blocking film 13 on the rear surface 12B faces the space 27 in the decompressed stage. Therefore, the blocking film 13 on the rear surface 12B is left just as it is, because it is not exposed to the etching gas.

Finally, as shown in FIG. 2I, an epitaxial silicon layer 14 is formed on the new front surface 12F of the polished silicon substrate 12.

In this way, a semiconductor substrate (a wafer) 15 on which the epitaxial silicon layer 14 has been grown on the silicon substrate 12 is manufactured.

Next, the manufacturing method of the semiconductor substrate of the second embodiment of the present invention will be described. FIGS. 4A to 4H are perspective views and cross sectional views illustrating the manufacturing method of the semiconductor substrate of the second embodiment of the present invention.

Because the processes shown in FIGS. 4A to 4F are the same as the processes of FIGS. 2A to 2F in the first embodiment, the explanation is omitted.

Figure 4:
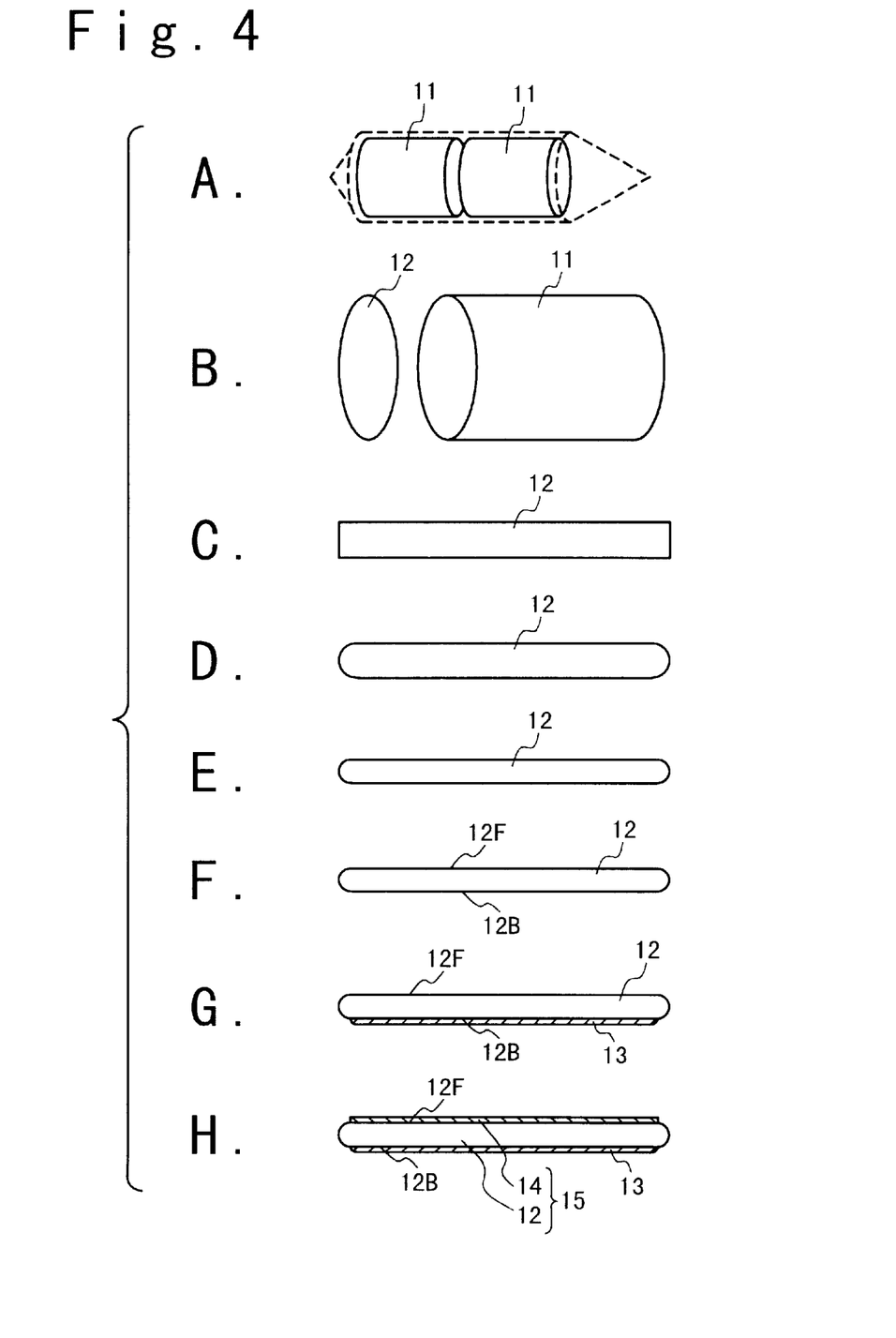
FIGS. 4A to 4H are process diagrams illustrating a method of manufacturing the semiconductor substrate according to a second embodiment of the present invention.

In the manufacturing method in the second embodiment, in the process shown in FIG. 4G, the blocking film 13 is formed only on the rear mirror surface 12B of silicon substrate 12.

Next, in the process shown in FIG. 4H, the epitaxial layer 14 is grown on the front mirror surface 12F of the silicon substrate 12 whose the rear surface 12B is covered by the blocking film 13.

In this manner, the silicon substrate wafer 15 is obtained in which the epitaxial layer is grown on the front mirror surface 12F of the silicon substrate 12.

Figure 5:
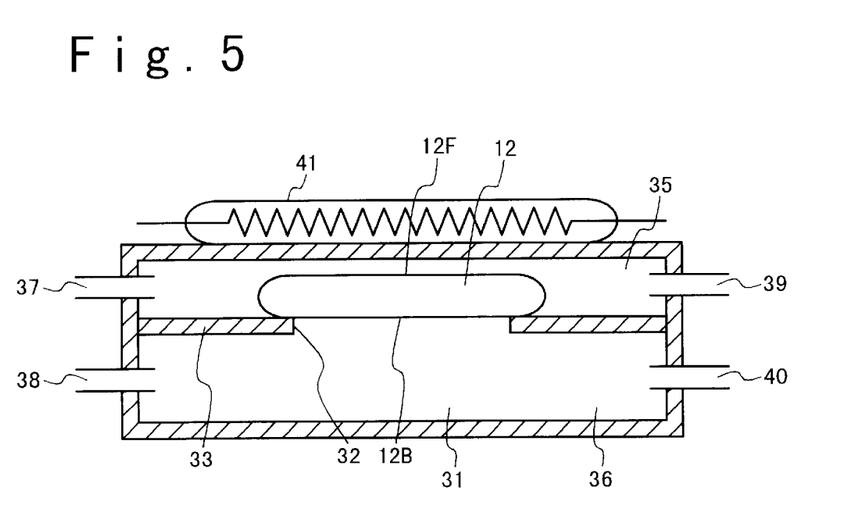
FIG. 5 is a diagram illustrating a manufacturing apparatus used in the method of manufacturing the semiconductor substrate according to the second embodiment of the present invention.

FIG. 5 is a diagram illustrating the structure of a film forming apparatus for forming the blocking film 13 only on the rear surface 12B of the silicon substrate 12, as shown in FIG. 4G. Referring to FIG. 5, this apparatus is composed of a reaction chamber 31, and a wafer supporting plate 33. The waver supporting plate 33 has an opening 32 with a diameter slightly smaller than that of the silicon substrate 12 to be processed, and separates the reaction chamber 31 into a lower part chamber 36 and an upper part chamber 35. The apparatus is also composed of a first gas introducing pipe 37 for introducing an inert gas into the upper part chamber 35, and a second gas introducing pipe 38 for introducing a film growing gas for a silicon oxide film and a silicon nitride film into the lower part chamber 36. The apparatus is further composed of a first gas exhausting pipe 39 for exhausting the inner gas from the upper part chamber 35, and a second gas exhaust 40 for exhausting the film growing gas from the lower part chamber 36. A heater 41 as heating means is provided.

The silicon substrate 12 is located on the wafer supporting plate 33 such that the peripheral portion of the rear surface 12B of the silicon substrate 12 is supported by a portion of the wafer supporting plate 33 around the opening 32. As a result, the opening 32 is covered by the silicon substrate 12. In this stage, the blocking film 13 is formed from the film growing gas on the main surface part of the rear surface 12B of the silicon substrate 12 which is exposed on the side of the lower part chamber 31 through the opening 32.

In the film forming apparatus shown in FIG. 5, the silicon substrate 12 is supported only in the peripheral portion of the rear surface 12B of the silicon substrate 12. The blocking film is grown only on the side of the rear surface of the silicon substrate 12. In accordance with, there is not a contact section of the support tool and the front mirror surface 12B of the silicon substrate 12. Thus, generation of flaws, adhesion of dusts and so on can be prevented on the side of the front surface of the silicon substrate 12. That is, the manufacturing apparatus shown in FIG. 5 is an apparatus for efficiently manufacturing a semiconductor substrate wafer in which the epitaxial layer is formed on a front mirror surface after the front and rear surfaces are polished in the mirror surface stage.

The wafer supporting plate 33 preferably is made of quartz or silicon carbide for preventing the adhesion of metal impurities and so on to silicon substrate 12. Also, it is preferably that a lamp heating system or a resistance heating system is employed for the heater 41. The silicon substrate 12 is preferably heated from the upper part of the manufacturing apparatus by the heater 41 provided on the manufacturing apparatus, from the lower part of the manufacturing apparatus by the heater 41 provided under the manufacturing apparatus, or from the upper and lower parts of the manufacturing apparatus by the heaters 41 provided on and under the manufacturing apparatus.

In the stage in which the silicon substrate 12 is heated by either of these methods, a blocking film growing gas is supplied through the gas introducing pipe 38 such that the blocking film 13 is formed on the rear surface 12B of the silicon substrate 12. At this time, the inert gas such as nitrogen, argon and so on is introduced into the upper part chamber 35 through the gas introducing pipe 37. The flow rate of the inert gas and the flow rate of the film growing gas are adjusted such that the pressure in the upper part chamber 35 is higher than the pressure in the lower chamber 36. Thus, it can be prevented that the film growing gas enters through a gap between the wafer supporting plate 33 and the silicon substrate 12 into the upper part chamber 35 of the manufacturing apparatus during the formation of the blocking film. As a result, the blocking film is not formed on the front mirror surface 12F of the silicon substrate 12.

As described above, according to the present invention, the blocking film is formed on both of the front and rear mirror surfaces of the silicon substrate which have polished in the mirror surface stage. Alternatively, the blocking film is formed on the rear mirror surface of the silicon substrate in which both the front and rear surfaces have polished in the mirror surface stage. Therefore, it is not necessary to polish the blocking film on the front surface by a chemical mechanical polishing method. In this manner, an epitaxial semiconductor wafer in which a silicon epitaxial layer is formed on the silicon substrate can be obtained by simplified manufacturing processes.

What is claimed is:

1. A method of manufacturing a semiconductor substrate, comprising the steps in sequence of:
   (A) providing a semiconductor substrate wafer cut from an ingot;
   (B) chemical mechanical polishing (CMP) said semiconductor substrate wafer to produce a semiconductor substrate wafer having CMP polished mirror surfaces on its respective front and rear surfaces;
   (C) forming a blocking film on the rear surface of the CMP polished semiconductor substrate wafer from step (B); and
   (D) growing an epitaxial layer directly on the CMP polished front surface of said semiconductor substrate wafer without first performing an additional mirror polishing step.

2. A method according to claim 1, wherein the blocking film is also formed on the front surface of said semiconductor substrate wafer in step (C); and including a step (C1) of etching the blocking film from the front surface of said semiconductor substrate wafer prior to performing step (D).

3. A method according to claim 2, wherein said etching step (C1) comprises the steps of:
   (C1a) placing said semiconductor substrate wafer from step (C) on a wafer supporting plate having an opening of diameter slightly smaller than the diameter of said semiconductor substrate wafer, whereby only a peripheral portion of the rear surface of said semiconductor substrate wafer is in contact with said wafer supporting plate;
   (C1b) drawing a vacuum from the rear surface of said semiconductor substrate wafer whereby to hold said semiconductor substrate wafer on said wafer supporting plate; and
   (C1c) etching the blocking film from only the front surface of said semiconductor substrate wafer.

4. A method according to claim 3, wherein said etching step (C1c) comprises:
   flowing an etching gas only onto the front surface of said semiconductor substrate wafer.

5. A method according to claim 4, wherein the blocking film comprises a silicon oxide film and said etching gas comprises hydrofluoric acid.

6. A method according to claim 3, wherein said etching step (C1c) is performed using an etching solution.

7. A method according to claim 1, wherein said blocking film is formed on the rear surface of the semiconductor substrate wafer by
   exposing the front surface of the CMP polished semiconductor substrate wafer from step (B) to an inert gas; and
   exposing the rear surface of said CMP polished semiconductor substrate wafer to a blocking film growing gas.

8. A method according to claim 7, wherein the rear surface of said CMP polished semiconductor substrate wafer is exposed to said blocking film growing gas at an elevated temperature.

9. A method according to claim 7, wherein the pressure of said inert gas on the front surface is higher than that of said blocking film growing gas on the rear surface.

10. A method of manufacturing a semiconductor substrate, comprising the steps in sequence of:
    (A) providing a semiconductor substrate wafer cut from an ingot;
    (B) chemical mechanical polishing (CMP) said semiconductor substrate wafer to produce CMP polished mirror surfaces on its respective front and rear surfaces;
    (C) forming a blocking film on the front and rear mirror surfaces of said CMP polished semiconductor substrate wafer; and
    (D) etching the blocking film only on the front surface of said CMP polished semiconductor substrate wafer without first performing an additional mirror polishing step.

11. A method according to claim 10, further comprising the step of (E) growing an epitaxial layer on the etched front surface of said CMP polished semiconductor substrate wafer.

12. A method according to claim 10, wherein the rear surface of said CMP polished semiconductor substrate wafer is held against a sealing member by vacuum so as to protect the rear surface during said etching step (D).

13. A method according to claim 12, wherein said blocking film is formed of a silicon oxide film, and the blocking film is etched using a hydrofluoric acid.

14. A method according to claim 13, wherein said hydrofluoric acid is used in a gaseous stage.

15. A method of manufacturing a semiconductor substrate, comprising the steps in sequence of:
    (A) providing a semiconductor substrate wafer cut from an ingot;
    (B) chemical mechanical polishing (CMP) said semiconductor substrate wafer to produce mirror surfaces on its respective front and rear surfaces;
    (C) forming a blocking film on the rear mirror surface of said CMP polished semiconductor substrate wafer; and
    (D) growing an epitaxial layer directly on the front mirror surface of said CMP semiconductor substrate wafer.

16. A method according to claim 15, wherein the blocking film is formed by heating the CMP polished semiconductor substrate wafer while simultaneously exposing the front surface of said CMP polished semiconductor substrate wafer to an inert gas and exposing the rear surface of said CMP polished semiconductor substrate wafer to a blocking film growing gas.

17. A method according to claim 16, wherein the pressure of the inert gas on the front surface is higher than that of the blocking film growing gas on the rear surface.

* * * * *

UNITED STATES PATENT AND TRADEMARK OFFICE
CERTIFICATE OF CORRECTION

PATENT NO. : 6,013,564
DATED : January 11, 2000
INVENTOR(S) : Satoru Muramatsu

It is certified that error appears in the above-identified patent and that said Letters Patent is hereby corrected as shown below:

<u>Column 8, claim 14,</u>
Line 41, "stage" should be -- state --

Signed and Sealed this

Nineteenth Day of March, 2002

Attest:

JAMES E. ROGAN
*Director of the United States Patent and Trademark Office*

*Attesting Officer*